US011996503B2

(12) United States Patent
Chang et al.

(10) Patent No.: US 11,996,503 B2
(45) Date of Patent: May 28, 2024

(54) DISPLAY DEVICE

(71) Applicant: Au Optronics Corporation, Hsinchu (TW)

(72) Inventors: Chi-Ho Chang, Hsinchu (TW); Jian-Jhou Tseng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 442 days.

(21) Appl. No.: 17/510,393

(22) Filed: Oct. 26, 2021

(65) Prior Publication Data

US 2023/0101106 A1 Mar. 30, 2023

(30) Foreign Application Priority Data

Sep. 30, 2021 (TW) ................. 110136454

(51) Int. Cl.
H01L 33/54 (2010.01)
H01L 27/15 (2006.01)
H01L 33/10 (2010.01)
H01L 33/62 (2010.01)

(52) U.S. Cl.
CPC ............ H01L 33/54 (2013.01); H01L 27/156 (2013.01); H01L 33/10 (2013.01); H01L 33/62 (2013.01)

(58) Field of Classification Search
CPC ...................................... H01L 33/54
See application file for complete search history.

(56) References Cited

U.S. PATENT DOCUMENTS

| 7,455,441 | B2 | 11/2008 | Chosa et al. |
| 10,468,394 | B1 | 11/2019 | Xi et al. |
| 2007/0109792 | A1 | 5/2007 | Chosa et al. |
| 2008/0203897 | A1* | 8/2008 | De Samber ........... H01L 33/642 |
| | | | 257/E33.072 |
| 2021/0134191 | A1 | 5/2021 | Jung et al. |
| 2021/0296536 | A1* | 9/2021 | Wang ...................... H01L 33/62 |

FOREIGN PATENT DOCUMENTS

| CN | 2563676 | 7/2003 |
| CN | 1846318 | 10/2006 |
| TW | I679627 | 12/2019 |

* cited by examiner

Primary Examiner — Mounir S Amer
(74) Attorney, Agent, or Firm — JCIPRNET

(57) ABSTRACT

A display device includes a first substrate, a first circuit structure, and light-emitting element package structures. The first circuit structure is located above the first substrate, and the first circuit structure has holes. Light-emitting element package structures are located above the first circuit structure. Each light-emitting element package structure includes a second substrate and at least one light-emitting element. The light emitting element is located between the second substrate and the first substrate, emitting toward the first circuit substrate, and overlapping with corresponding hole of the first circuit structure. The width of the corresponding hole near the first substrate is greater than the width of the corresponding hole near the second substrate.

19 Claims, 16 Drawing Sheets

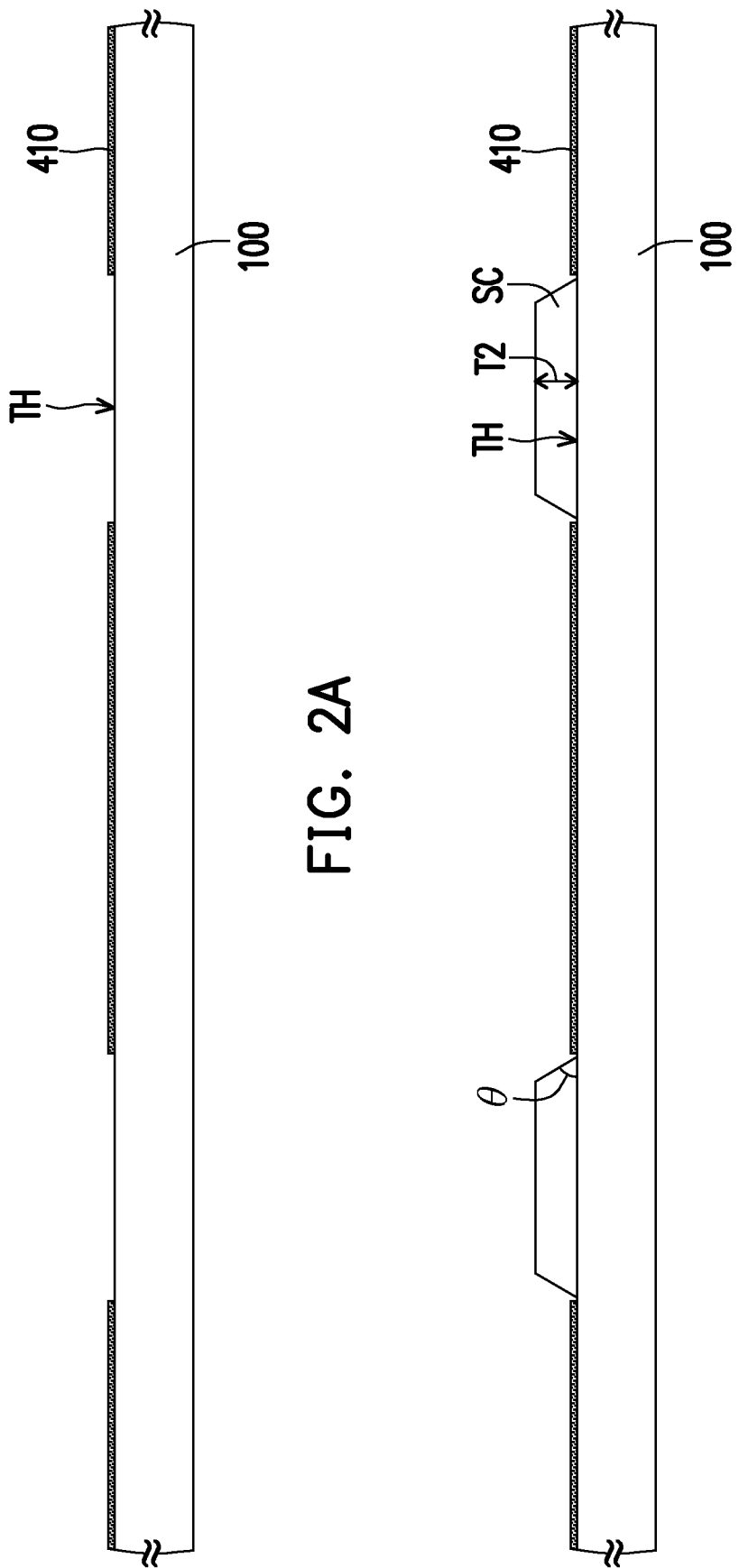

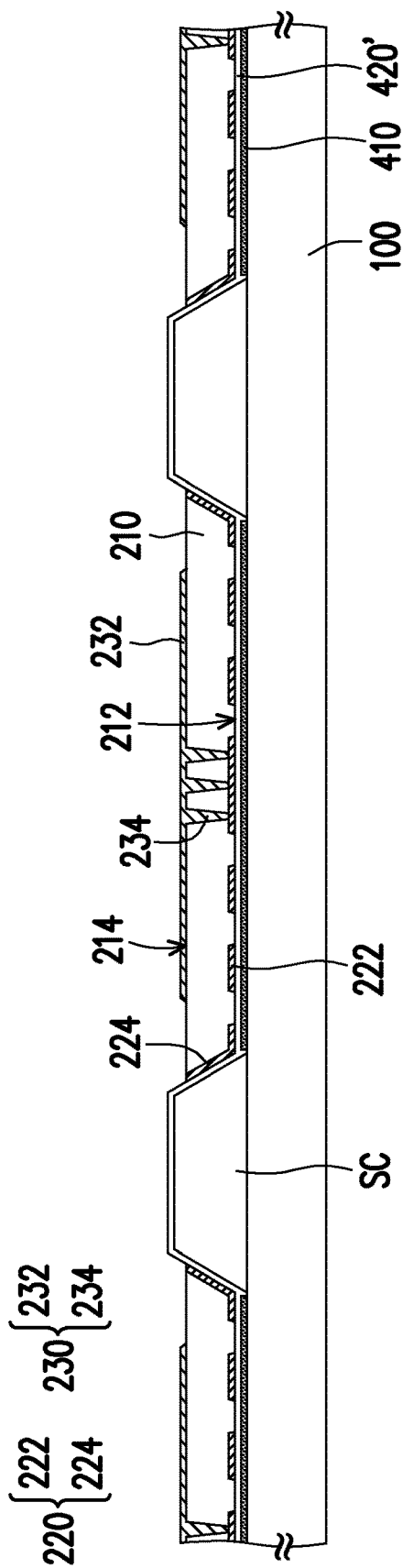
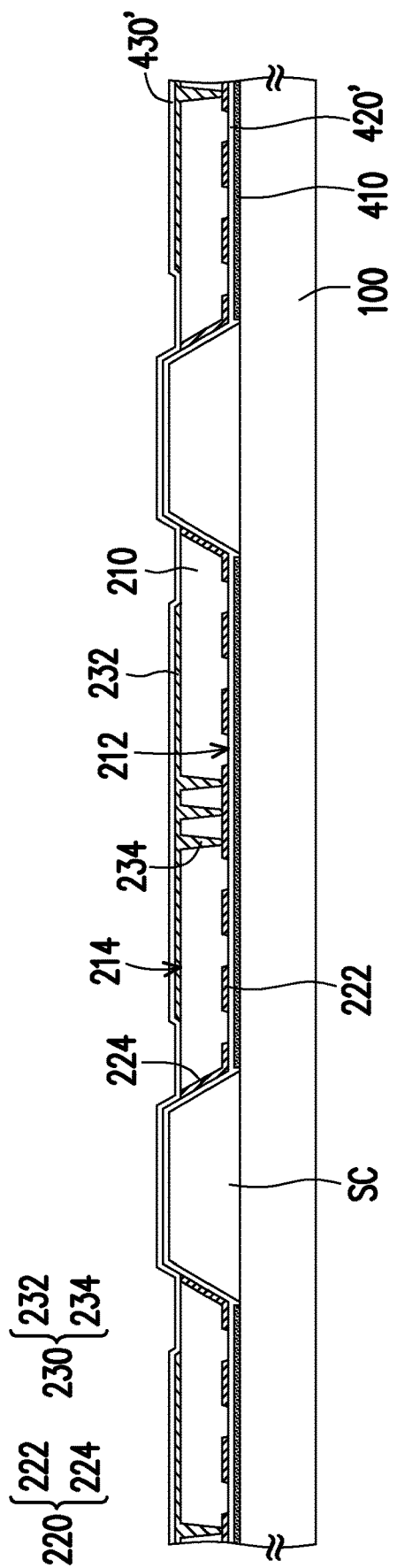
FIG. 3C
FIG. 3D

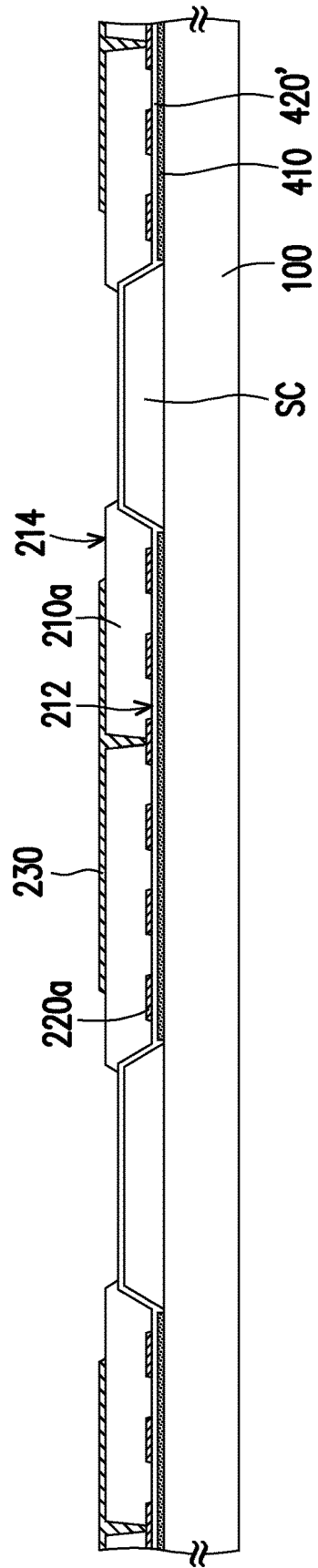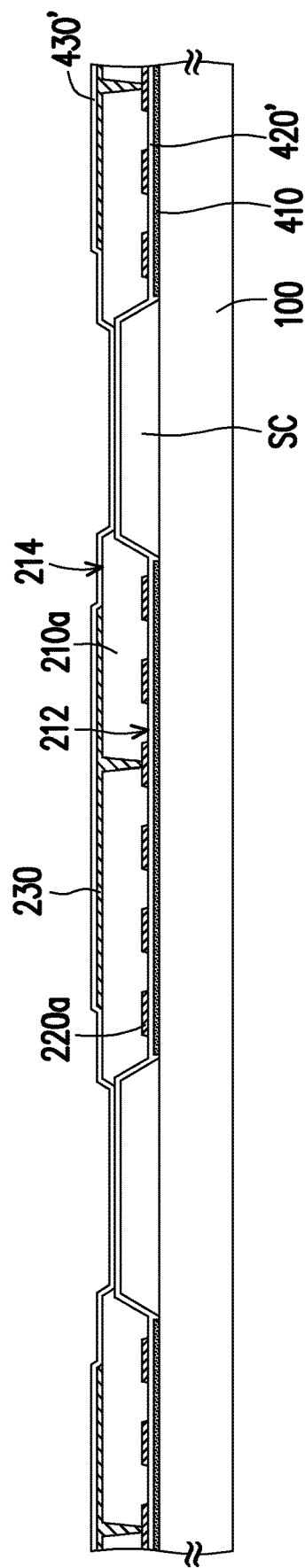
FIG. 4C
FIG. 4D

DISPLAY DEVICE

CROSS-REFERENCE TO RELATED APPLICATION

This application claims the priority benefit of Taiwan application serial no. 110136454, filed on Sep. 30, 2021. The entirety of the above-mentioned patent application is hereby incorporated by reference herein and made a part of this specification.

BACKGROUND

Technical Field

The present invention relates to a display device.

Description of Related Art

Micro light emitting device display (micro LED display) is a new generation of display technology. The key technology is how to use mass transfer technique to transfer micro LEDs onto a circuit board. However, the mass transfer technique is a mechanical operation, and the effectiveness of the mass transfer technique depends on the accuracy of the machine and the accuracy of the transfer device. If the micro LEDs are not placed on the correct position, the micro LEDs will not work normally. In addition, how to improve the luminous efficiency of the micro LEDs is also a topic of research for many researchers.

SUMMARY

The present invention provides a display device, which can increase the brightness of the display device.

At least one embodiment of the present invention provides a display device. The display device includes a first substrate, a first circuit structure, and a plurality of light-emitting element package structures. The first circuit structure is located above the first substrate, and the first circuit structure has a plurality of holes. The plurality of light-emitting element package structures are located above the first circuit structure. Each light-emitting element package structure includes a second substrate and at least one light-emitting element. The light-emitting element is located between the second substrate and the first substrate, emits light toward the first substrate, and is overlapping with a corresponding hole of the first circuit structure. The width of the corresponding hole near the first substrate is greater than the width of the corresponding hole near the second substrate.

BRIEF DESCRIPTION OF THE DRAWINGS

FIGS. 2A to 2J are schematic cross-sectional views of a manufacturing method of a display device according to an embodiment of the present invention.

FIGS. 3A to 3G are schematic cross-sectional views of a manufacturing method of a display device according to an embodiment of the present invention.

FIGS. 4A to 4G are schematic cross-sectional views of a manufacturing method of a display device according to an embodiment of the present invention.

DESCRIPTION OF THE EMBODIMENTS

Figure 1A:
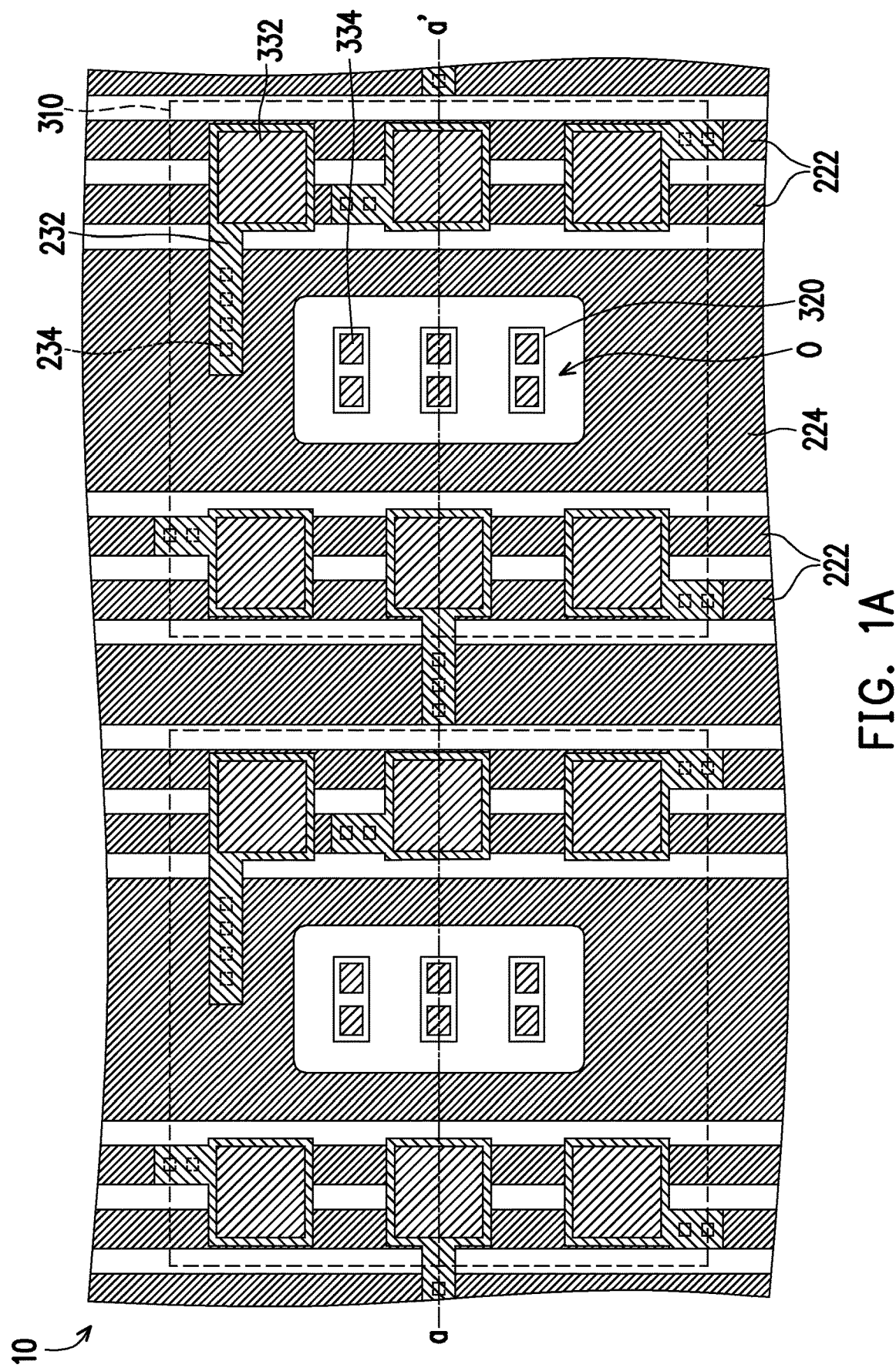
FIG. 1A is a schematic top view of a display device according to an embodiment of the invention.

In the present disclosure, relative terms such as "below" or "bottom" and "above" or "top" may serve to describe the relation between one component and another component in the text according to the illustration of the drawings. It should be understood that the relative terms intend to include different orientations of an apparatus in addition to the orientation shown in the drawings. For example, if an apparatus in the drawings is flipped, a component described as being disposed to be "lower" than other components shall be orientated again to be "higher" than other components. Thus, the exemplary term "lower" may cover the orientations of "lower" and "higher", depending on a specific orientation of the drawings. Similarly, if an apparatus in the drawings is flipped, a component described as being "below" other components may be orientated again to be "above" other components. Thus, the exemplary term "lower" may cover the orientations of "above" and "below".

Figure 1B:
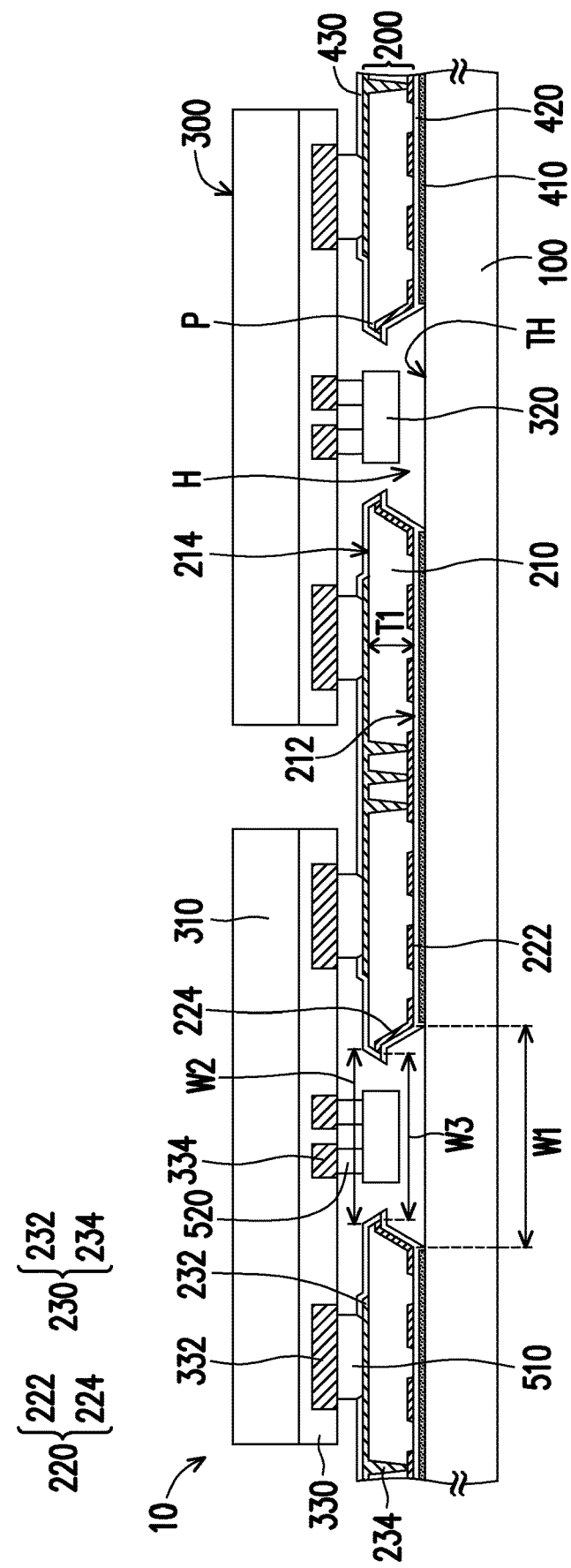
FIG. 1B is a schematic cross-sectional view taken along the line a-a' of FIG. 1A.

FIG. 1A is a schematic top view of a display device according to an embodiment of the invention. FIG. 1B is a schematic cross-sectional view taken along the line a-a' of FIG. 1A. It should be noted that, for the convenience of description, some of the components in FIG. 1B are omitted in FIG. 1A.

Referring to FIGS. 1A and 1B, the display device 10 includes a first substrate 100, a first circuit structure 200, and a plurality of light-emitting element package structures 300. In this embodiment, the display device 10 further includes a plurality of light shielding layers 410, a first covering layer 420, and a second covering layer 430.

The first substrate 100 is a transparent substrate, and its material includes glass, quartz, organic polymer or other applicable materials.

The light shielding layer 410 is located above the first substrate 100. The light-shielding layer 410 is a light absorption material, and includes black photoresist, resin, chrome, or other suitable materials. In this embodiment, the light shielding layer 410 directly contacts the upper surface of the first substrate 100, but the invention is not limited thereto. In other embodiments, a buffer layer or other insulating layer is further included between the light shielding layer 410 and the first substrate 100. In this embodiment, the light shielding layer 410 has a plurality of through holes TH. The first covering layer 420 is located on the light shielding layer 410. The first covering layer 420 includes, for example, an insulating material.

The first circuit structure 200 is located above the first substrate 100. In this embodiment, the first circuit structure 200 is located on the first covering layer 420. The first circuit structure 200 has a plurality of holes H. The through holes TH of the light shielding layer 410 are overlapping with the holes H of the first circuit structure 200. In some embodiments, the width of the through hole TH of the light shielding layer 410 is greater than the width of the hole H of the first circuit structure 200. In some embodiments, the first covering layer 420 is extending from the upper surface of the first substrate 100 along the sidewalls of the holes H of the first circuit structure 200 away from the upper surface of the first substrate 100. A part of the first covering layer 420 is located between the first substrate 100 and the first circuit structure 200, and another part of the first covering layer 420 is located in the holes H of the first circuit structure 200.

The first circuit structure 200 includes an insulating structure 210, a first circuit layer 220 and a second circuit layer 230.

The insulating structure 210 has a first surface 212 facing the first substrate 100 and a second surface 214 facing away from the first surface 212. The insulating structure 210 may be a single-layer or multi-layer structure. In some embodiments, the insulating structure 210 includes silicon oxide, silicon nitride, silicon oxynitride, aluminum oxide, hafnium oxide, zirconium oxide, an organic insulating material, a combination of the foregoing materials, or other insulating materials. In some embodiments, the final overall thickness T1 of the insulating structure 210 is preferably 4 μm to 10 μm, but it is not limited thereto. In some other embodiments, the overall thickness T1 of the insulating structure 210 may be less than 4 μm or greater than 10 μm.

The first circuit layer 220 is located on the first surface 212 of the insulating structure 210. In some embodiments, the first circuit layer 220 is located on the first covering layer 420, and the first circuit layer 220 is separated from the light shielding layer 410 by the first covering layer 420. The first circuit layer 220 has a single-layer or multi-layer structure. In some embodiments, the first circuit layer 220 includes metal such as chrome, gold, silver, copper, tin, lead, hafnium, tungsten, molybdenum, neodymium, titanium, tantalum, aluminum, zinc, alloys of above, or oxides of the above-mentioned metal, nitrides of the above-mentioned metal, a combination of the above, or other conductive materials.

In some embodiments, the insulating structure 210 includes a reflective material or does not include a reflective material. When the insulating structure 210 does not include a reflective material, the first circuit layer 220 includes a plurality of signal lines 222 located on the first surface 212 of the insulating structure 210 and a plurality of reflective layers 224 located on the sidewalls of the holes H. The reflective layer 224 has a single-layer or multi-layer structure. In some embodiments, the signal lines 222 and the reflective layers 224 belong to the same conductive layer. In other words, the signal lines 222 and the reflective layers 224 are formed by patterning the same conductive material layer. In some embodiments, the reflective layers 224 extend from the sidewalls of the holes H to the first surface 212 of the insulating structure 210.

In some embodiments, the vertical projection of the reflective layers 224 on the first substrate 100 have a plurality of openings O overlapping the light emitting element 320 (please refer to FIG. 1A). The position of the openings O corresponds to the position of the holes H of the first circuit structure 200. In this embodiment, each opening O is overlapping with a plurality of light-emitting elements 320, but the invention is not limited thereto. In other embodiments, each opening O is overlapping with one corresponding light emitting element 320.

The second circuit layer 230 is located on the second surface 214 of the insulating structure 210. In some embodiments, the second circuit layer 230 includes connection electrodes 232 and conductive holes 234. The connection electrodes 232 are located on the second surface 214 of the insulating structure 210. The conductive holes 234 are located in the opening of the insulating structure 210. In some embodiments, the connection electrodes 232 are electrically connected to the first circuit layer 220 through the conductive holes 234. In other words, the second circuit layer 230 is electrically connected to the first circuit layer 220. In some embodiments, the second circuit layer 230 has a single-layer or multi-layer structure. In some embodiments, the second circuit layer 230 includes metal such as chrome, gold, silver, copper, tin, lead, hafnium, tungsten, molybdenum, neodymium, titanium, tantalum, aluminum, zinc, alloys of above, or oxides of the above-mentioned metal, nitrides of the above-mentioned metal, a combination of the above, or other conductive materials.

The second covering layer 430 is located on the first circuit structure 200. In this embodiment, the second covering layer 430 is located on the second circuit layer 230. The second covering layer 430 includes, for example, an insulating material. In some embodiments, the second covering layer 430 and the first covering layer 420 include the same or different materials. In some embodiments, the second covering layer 430 extends from the second surface 214 of the insulating structure 210 along the sidewalls of the hole H of the first circuit structure 200 toward the upper surface of the first substrate 100. In some embodiments, part of the second covering layer 430 is located on the second surface 214 of the insulating structure 210, and another part of the second covering layer 430 is located in the hole H of the first circuit structure 200. In some embodiments, the first covering layer 410 is connected to the second covering layer 430 in the holes H.

A plurality of first conductive connection structures 510 are located on the first circuit structure 200. In this embodiment, the first conductive connection structures 510 are located in the openings of the second covering layer 430 and are connected to the connection electrodes 232 of the second circuit layer 230. In some embodiments, the first conductive connection structures 510 include solders (for example, tin, indium, bismuth, or other suitable materials or a combination of the foregoing materials) or conductive glue.

A plurality of light-emitting element package structures 300 are located above the first circuit structure 200. Each light-emitting element package structure 300 includes a second substrate 310 and a plurality of light-emitting elements 320. In this embodiment, each light-emitting element package structure 300 further includes a second circuit structure 330.

The second substrate 310 is preferably a transparent substrate, and its material includes glass, quartz, organic polymer or other applicable materials, but it is not limited thereto. In some embodiments, the second substrate 310 may be an opaque substrate, and its material may be an epoxy resin-glass fiber composite material commonly used in printed circuit boards or other special resins (such as bismaleimide modified triazine resin). In this embodiment, the size of the second substrate 310 is smaller than the size of the first substrate 100. The first substrate 100 is overlapping with the plurality of second substrates 310. The second covering layer 430 is located between the first circuit structure 200 and the second substrate 310.

The second circuit structure 330 is located on the second substrate 310. In some embodiments, the second circuit structure 330 is a multilayer structure and includes at least one conductive layer and at least one insulating layer. In some embodiments, the second circuit structure 330 includes a plurality of first pads 332 and a plurality of second pads 334. In some embodiments, the second circuit structure 330 further includes a plurality of wires (not shown), and the wires are electrically connected to the first pads 332 and/or the second pads 334. In this embodiment, each light-emitting element package structure 300 is electrically connected to the first circuit structure 200 through the first conductive connection structures 510. For example, the first pads 332 are bonded to the second circuit layer 230 of the first circuit structure 200 through the first conductive connection structures 510. In some embodiments, the size of the first pad 332 is larger than the size of the second pad 334, thereby improving the yield of the bonding process of the light-emitting element package structure 300 and the first circuit structure 200. In addition, each light-emitting element package structure 300 includes a plurality of light-emitting elements 320, thereby improving the yield of the process of transferring the light-emitting elements 320 onto the first substrate 100.

The light-emitting elements 320 are located between the second substrate 310 and the first substrate 100 and emitting lights toward the first substrate 100. In this embodiment, the light-emitting elements 320 are electrically connected to the second pads 334. For example, the light-emitting element 320 are connected to the second pads 334 through the second conductive connection structures 520. The second conductive connection structures 520 include solders (for example, tin, indium, bismuth, or other suitable materials or a combination of the foregoing materials) or conductive glue.

In this embodiment, each light-emitting element package structure 300 includes three light-emitting elements 320, and the three light-emitting elements 320 are light-emitting elements of different colors (for example, a red light-emitting element, a green light-emitting element, and a blue light-emitting element), and each light-emitting element package structure 300 corresponds to a color pixel, but the invention is not limited thereto. In other embodiments, each light-emitting element package structure 300 includes more light-emitting elements, and each light-emitting element package structure 300 corresponds to a plurality of color pixels. Alternatively, in some other embodiments, each light-emitting element package structure 300 only includes a single light-emitting element, and each light-emitting element packaging structure 300 corresponds to one sub-color pixel. In this embodiment, the light-emitting elements 320 are micro light-emitting diodes or other light-emitting elements.

The light-emitting elements 320 are overlapping with the corresponding holes H of the first circuit structure 200. For example, the light emitting elements 320 are located in the holes H. In this embodiment, the light-emitting elements 320 in each light-emitting element package structure 300 are overlapping with one corresponding hole H, but the invention is not limited thereto. In other embodiments, each light-emitting element 320 is overlapping with one corresponding hole H. In this embodiment, the width W1 of the hole H near the first substrate 100 is greater than the width W2 of the hole H near the second substrate 310.

By making the width W1 larger than the width W2, the lights emitted by the light-emitting elements 320 can be better reflected to a direction toward the first substrate 100, so that the display device 10 has high brightness.

In some embodiments, the insulating structure 210 of the first circuit structure 200 protrudes toward the light emitting elements 320 near the sidewalls of the holes H, as shown by the protrusions P of the insulating structure 210 in the figure. The position of the minimum width W3 of the hole H is located between the first surface 212 and the second surface 214 of the insulating structure 210 and corresponds to the position of the protrusions P. In this embodiment, the minimum width W3 of the hole H is substantially equal to the width of the opening O.

FIGS. 2A to 2J are schematic cross-sectional views of a manufacturing method of a display device according to an embodiment of the present invention. It should be noted herein that, in embodiments provided in FIGS. 2A to 2J, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 2A, a light shielding layer 410 is formed on the first substrate 100. For example, a light-shielding material is deposited on the first substrate 100, and then the light-shielding material is patterned to form the light-shielding layer 410. The light shielding layer 410 has a plurality of through holes TH.

Referring to FIG. 2B, a sacrificial layer SC is formed on the first substrate 100. In this embodiment, the sacrificial layer SC is formed in the through holes TH of the light shielding layer 410.

The material of the sacrificial layer SC includes, for example, photoresist, metal or other suitable materials. In some embodiments, the thickness T2 of the sacrificial layer SC is 4 μm to 10 μm, but it is not limited thereto. In other embodiments, the thickness T2 of the sacrificial layer SC may be less than 4 μm or greater than 10 μm.

In this embodiment, the angle θ between the side surface of the sacrificial layer SC and the upper surface of the first substrate 100 is preferably 30 degrees to 70 degrees, but is not limited thereto.

Figure 2C:
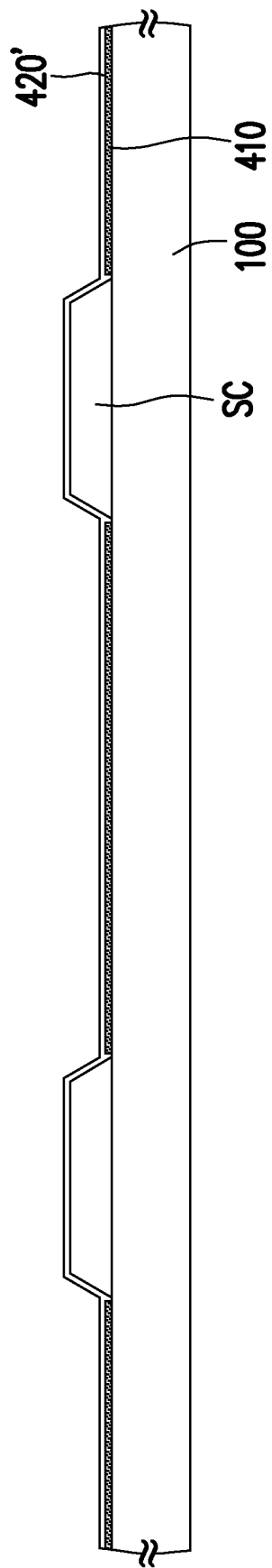

Referring to FIG. 2C, a first covering material layer 420' is formed on the light-shielding layer 410 and the sacrificial layer SC. The first covering material layer 420' covers the top surface of the light-shielding layer 410, the side surfaces of the sacrificial layer SC, and the top surface of the sacrificial layer SC.

Figure 2D:
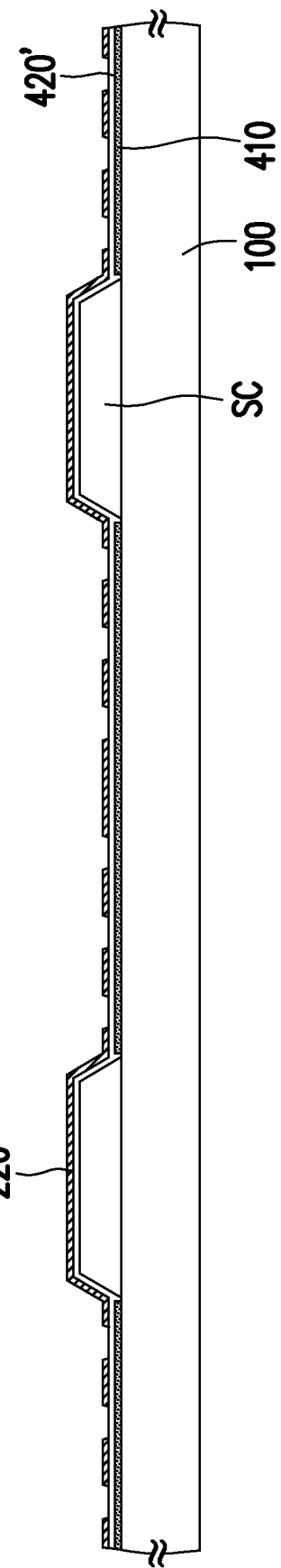
Figure 2E:
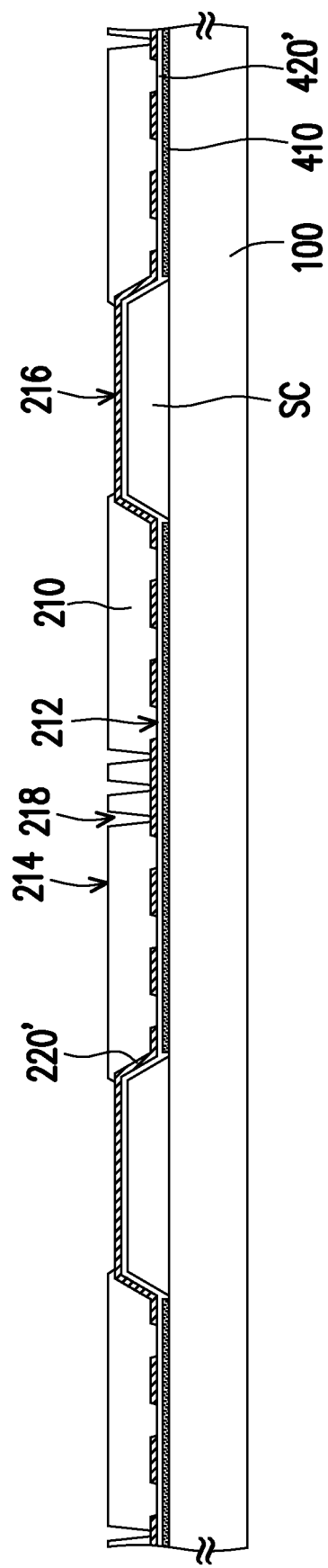

Referring to FIG. 2D, a first conductive material 220' is formed on the first covering material layer 420'. In this embodiment, the first conductive material 220' covers the side surfaces and the top surface of the sacrificial layer SC. In this embodiment, the first conductive material 220' is a patterned conductive layer. For example, a conductive material is deposited on the first covering material layer 420', and then the conductive material is patterned to form the first conductive material 220'.

Referring to 2E, an insulating structure 210 is formed on the first conductive material 220' and the first covering material layer 420'. In this embodiment, the top surface (the second surface 214) of the insulating structure 210 is higher than the top surface of the first conductive material 220' above the sacrificial layer SC, and the insulating structure 210 covers a portion of the top surface of the first conductive material 220' above the sacrificial layer SC. In this embodiment, the opening 216 of the insulating structure 210 above the sacrificial layer SC exposes a portion of the top surface of the first conductive material 220'. In addition, in this embodiment, the insulating structure 210 further includes openings 218 that are not overlapping with the sacrificial layer SC. The openings 218 are overlapping with a portion of the first conductive material 220'.

Figure 2F:
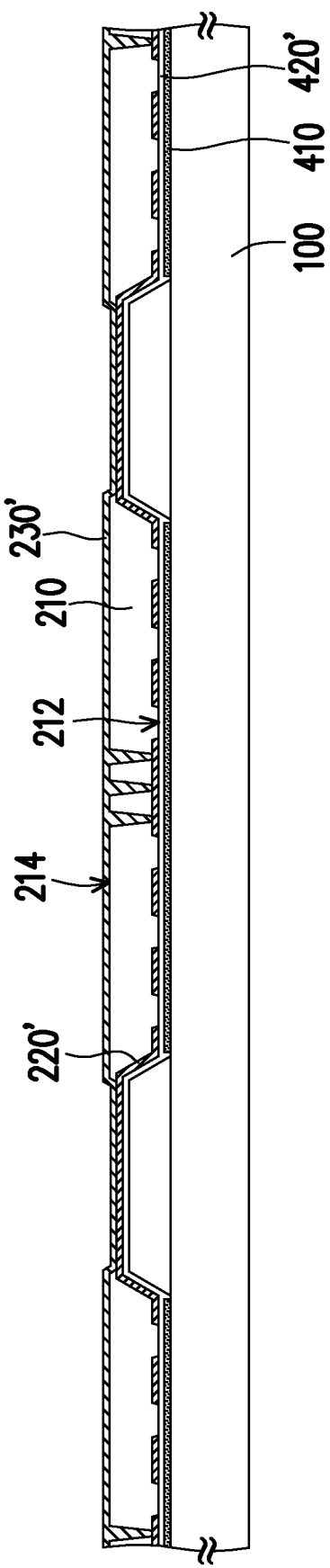
Figure 2G:
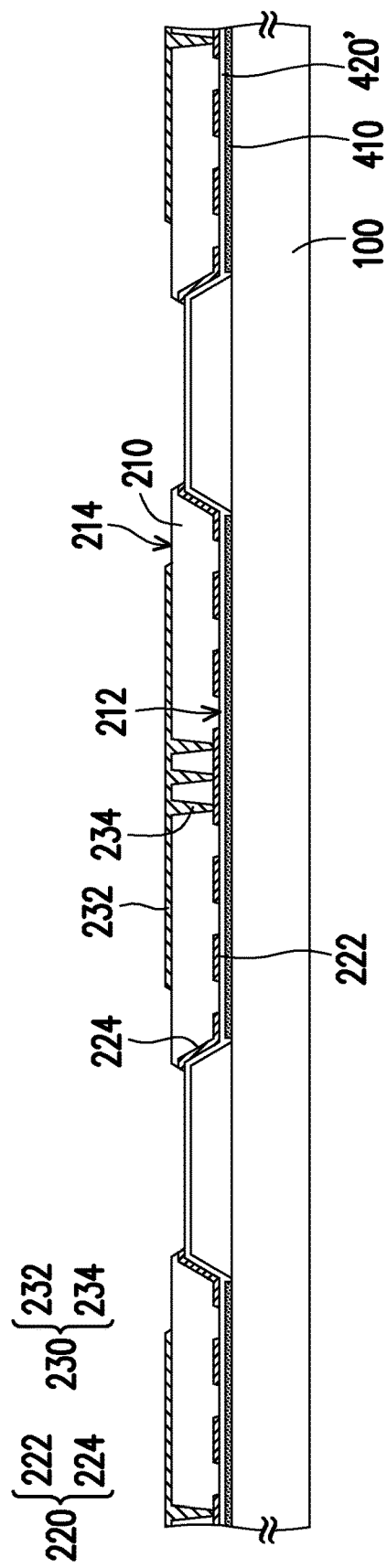

Referring to FIGS. 2F and 2G, a second conductive material 230' is formed on the insulating structure 210. The second conductive material 230' is filled into the openings 216 and the openings 218, and is in contact with the first conductive material 220'.

The second conductive material 230' is patterned to form the second circuit layer 230. In this embodiment, while patterning the second conductive material 230', a part of the first conductive material 220' is removed to form the first circuit layer 220. Specifically, a photoresist layer (not shown) is formed on the second conductive material 230', and an etching process is performed using the photoresist layer as a mask to form the first circuit layer 220 and the second circuit layer 230. The aforementioned etching process removes the first conductive material 220' and the second conductive material 230' above the sacrificial layer SC.

Figure 2H:
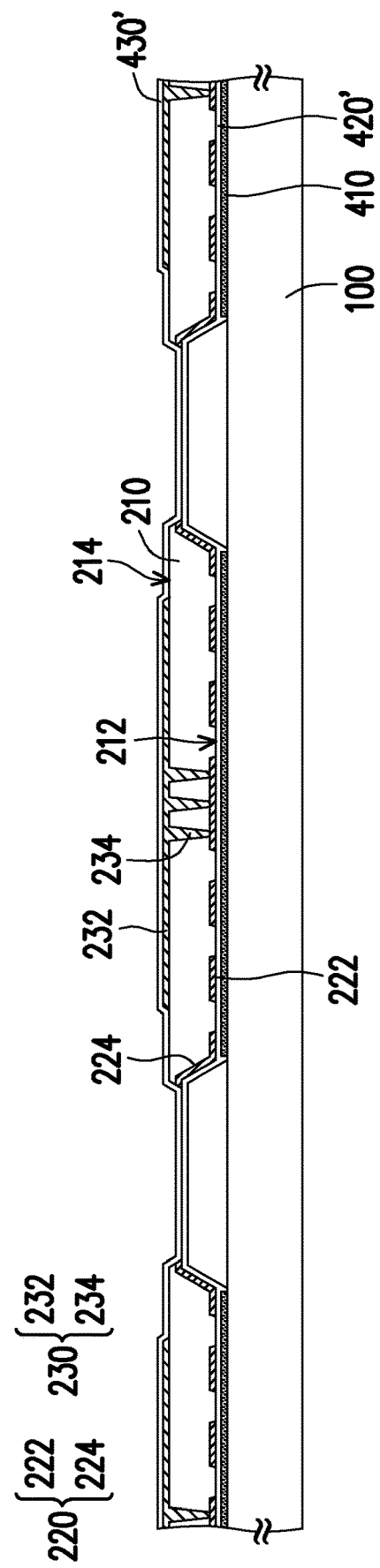

Referring to FIG. 2H, a second covering material layer 430' is formed on the second circuit layer 230. In this embodiment, the second covering material layer 430' is in contact with the first covering material layer 420' on the top surface of the sacrificial layer SC.

Figure 2I:
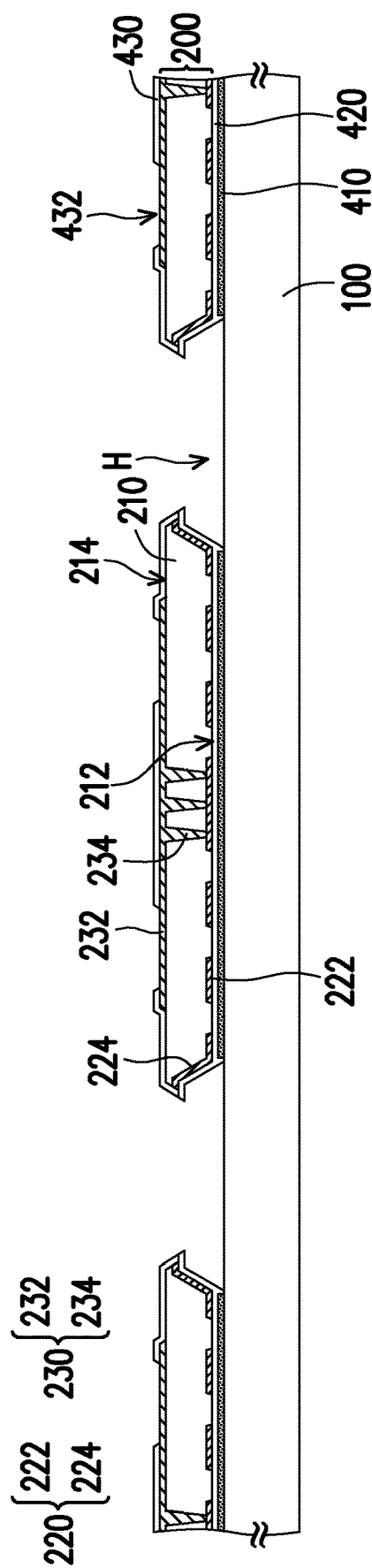

Referring to FIG. 2I, the sacrificial layer SC is removed to form the hole H of the first circuit structure 200. In this embodiment, the sacrificial layer SC is a photoresist material. First, a photoresist layer (not shown) is formed on the second covering material layer 430', and the first covering material layer 420' on the top surface the sacrificial layer SC and the second covering material layer 430' on the top surface of the sacrificial layer SC are removed by performing an etching process using the photoresist layer as a mask, so as to form the first covering layer 420 and the second covering layer 430, then the aforementioned photoresist layer and sacrificial layer SC are removed together in a photoresist stripping process. In some other embodiments, the sacrificial layer SC is made of a metal material different from the material of the second circuit layer 230. For example, the second circuit layer 230 is a stack of metal materials of titanium/aluminum/titanium, and the sacrificial layer SC is made of a metal material of molybdenum. After the stripping process, a wet etching process is performed to remove the sacrificial layer SC. In this embodiment, before removing the sacrificial layer SC, after removing the sacrificial layer SC, or while removing the sacrificial layer SC, the second covering material layer 430' is patterned to expose a part of the second circuit layer 230. In other words, the second covering layer 430 has openings 432 exposing the connection electrodes 232 of the second circuit layer 230.

In some embodiments, the method of removing the sacrificial layer SC includes a stripping process, an etching process, or other suitable processes.

Figure 2J:
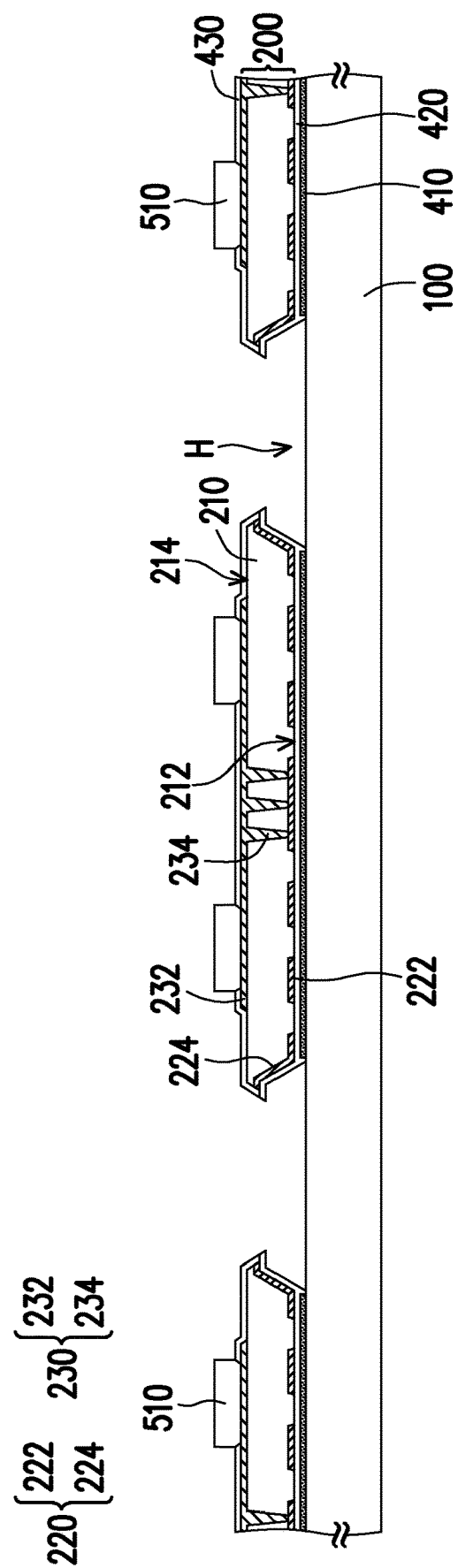

Referring to FIG. 2J, first conductive connection structures 510 are formed on the second circuit layer 230. The first conductive connection structures 510 are, for example, disposed in the openings 432 on the second circuit layer 230. After the first conductive connection structures 510 are formed, the light-emitting element package structures 300 are bonded to the first circuit structure 200, as shown in FIG. 1B.

FIGS. 3A to 3G are schematic cross-sectional views of a manufacturing method of a display device according to an embodiment of the present invention. It should be noted herein that, in embodiments provided in FIGS. 3A to 3G, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Figure 3A:
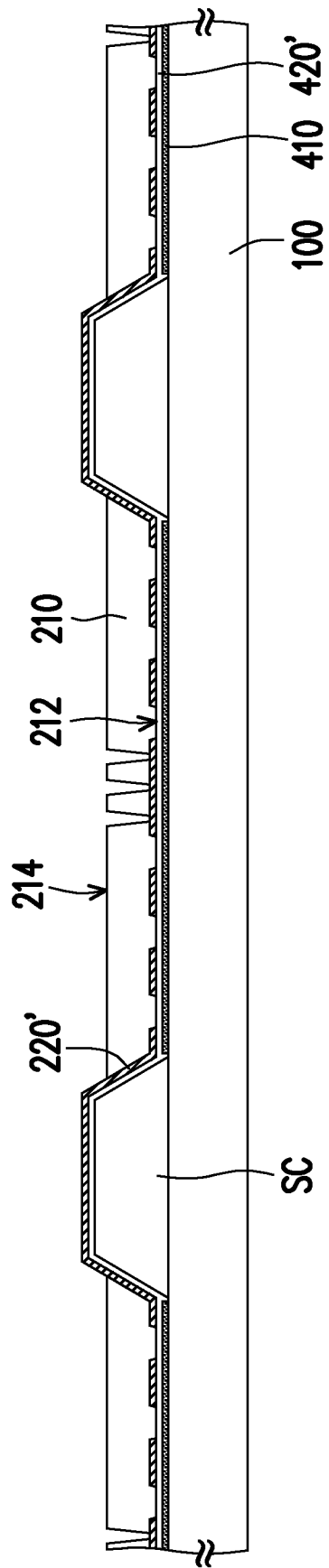

FIG. 3A continues the process of FIG. 2D. Referring to FIG. 3A, after the first conductive material 220' is formed, an insulating structure 210 is formed on the first conductive material 220' and the first covering material layer 420'. In this embodiment, the top surface (the second surface 214) of the insulating structure 210 is lower than the top surface of the first conductive material 220' above the sacrificial layer SC. In this embodiment, the insulating structure 210 exposes a portion of the first conductive material 220' located above the sacrificial layer SC and a portion of the first conductive material 220' located on the side surfaces of the sacrificial layer SC.

Figure 3B:
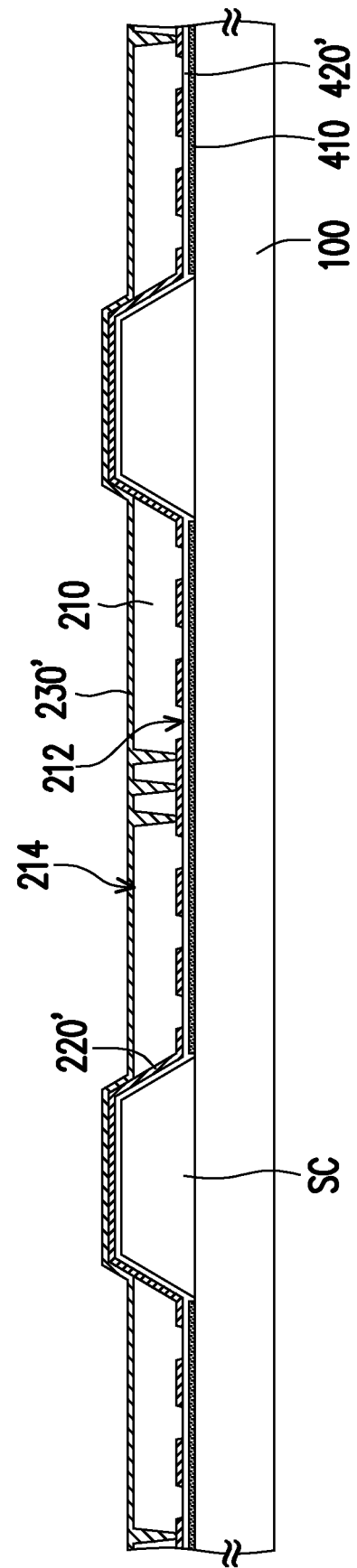

Referring to FIGS. 3B and 3C, a second conductive material 230' is formed on the insulating structure 210. The second conductive material 230' is patterned to form the second circuit layer 230. In this embodiment, while patterning the second conductive material 230', a part of the first conductive material 220' is removed to form the first circuit layer 220. Specifically, a photoresist layer (not shown) is formed on the second conductive material 230', and an etching process is performed using the photoresist layer as a mask to form the first circuit layer 220 and the second circuit layer 230. The etching process removes the first conductive material 220' and the second conductive material 230' above the sacrificial layer SC. In this embodiment, the etching process further removes a portion of the first conductive material 220' that exceeds the top surface of the insulating structure 210. In other words, in this embodiment, the reflective layer 224 in the first circuit layer 220 does not cover all of side surfaces of the sacrificial layer SC.

Referring to FIG. 3D, a second covering material layer 430' is formed on the second circuit layer 230. In this embodiment, the second covering material layer 430' is in contact with the first covering material layer 420' on the top surface of the sacrificial layer SC.

Figure 3E:
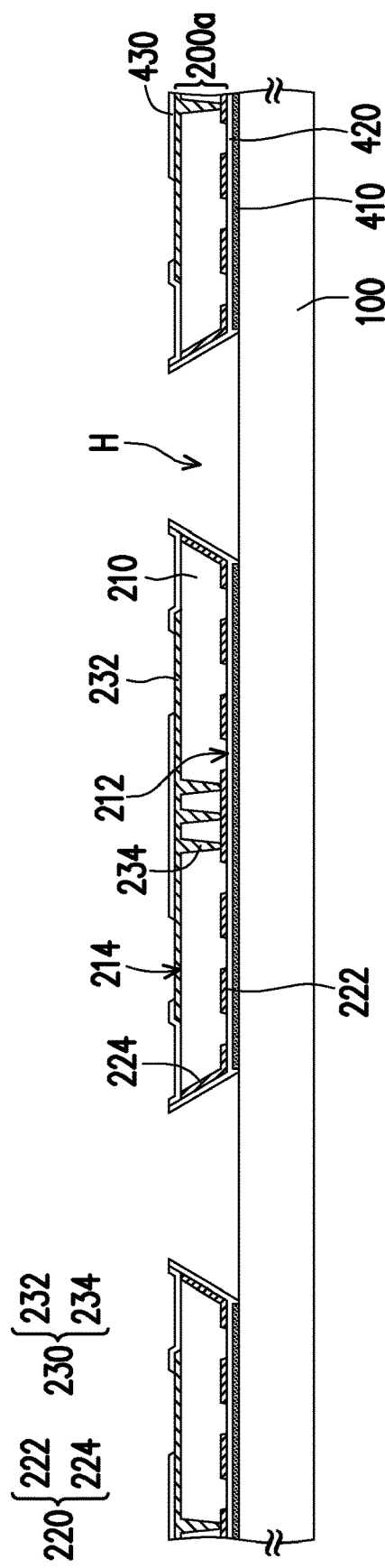

Referring to FIG. 3E, the sacrificial layer SC is removed by the process disclosed in FIG. 2I to form the holes H of the first circuit structure 200a. In this embodiment, the width of the holes H gradually decreases as the distance from the first substrate 100 increases.

In this embodiment, while removing the sacrificial layer SC, the first covering material layer 420' on the top surface of the sacrificial layer SC and the second covering material layer 430' on the top surface of the sacrificial layer SC are removed together to form the first covering layer 420 and the second covering layer 430. In this embodiment, before removing the sacrificial layer SC, after removing the sacrificial layer SC, or while removing the sacrificial layer SC, the second covering material layer 430' is patterned to expose a part of the second circuit layer 230. In other words, the second covering layer 430 has openings exposing the connection electrodes 232 of the second circuit layer 230.

In some embodiments, the method for removing the sacrificial layer SC includes a stripping process, an etching process, or other suitable processes.

Figure 3F:
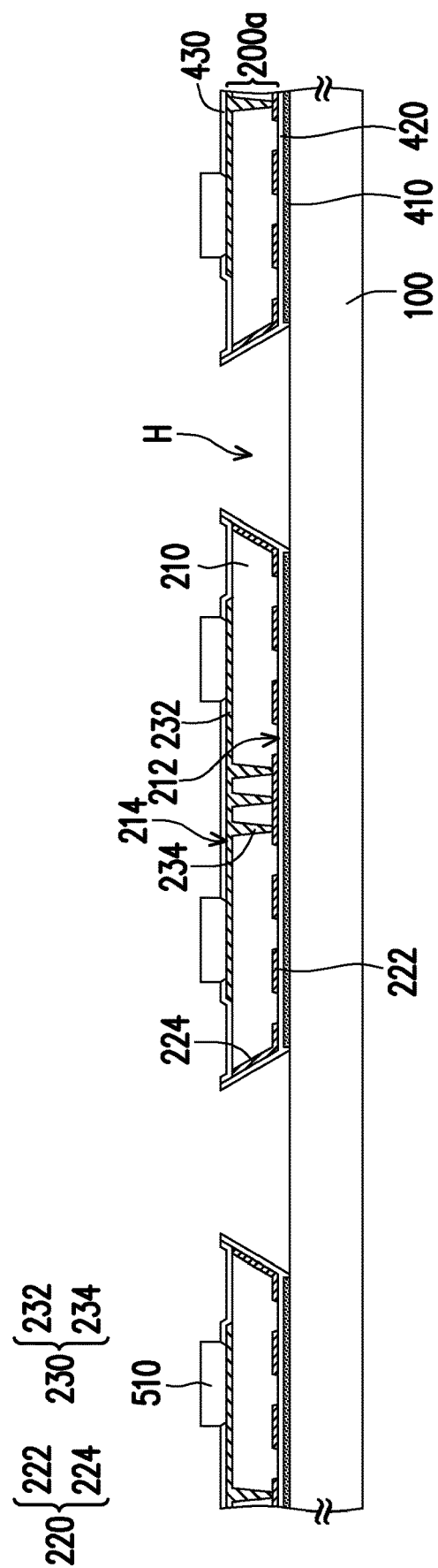

Referring to FIG. 3F, first conductive connection structures 510 are formed on the second circuit layer 230.

Figure 3G:
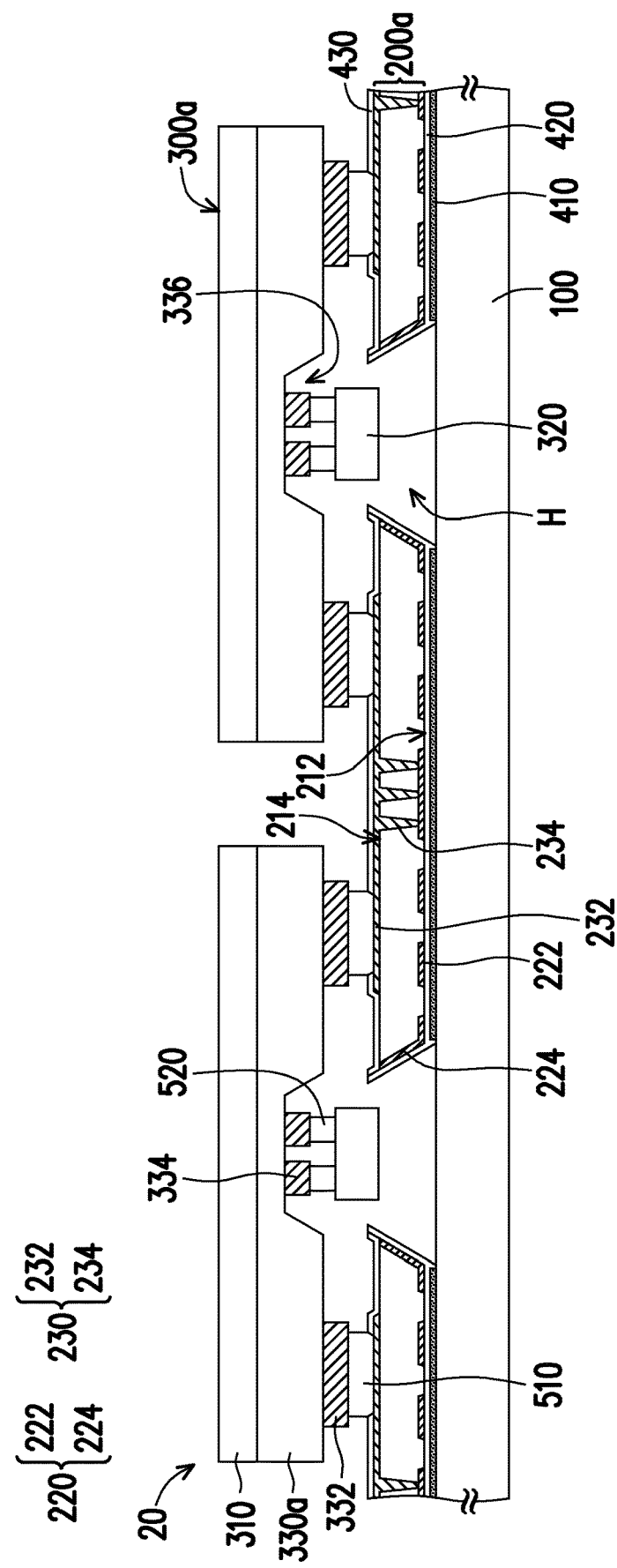

Referring to FIG. 3G, the light-emitting element package structures 300a are bonded to the first circuit structure 200a. So far, the display device 20 is roughly completed.

In this embodiment, the light-emitting element package structure 300a includes a second substrate 310 and a plurality of light-emitting elements 320. In this embodiment, each light-emitting element package structure 300 further includes a second circuit structure 330a.

The second circuit structure 330a is located on the second substrate 310. In some embodiments, the second circuit structure 330a is a multi-layer structure and includes at least one conductive layer and at least one insulating layer. In some embodiments, the second circuit structure 330a includes a plurality of first pads 332 and a plurality of second pads 334. In some embodiments, the second circuit structure 330a further includes a plurality of wires (not shown), and the wires are electrically connected to the first pads 332 and/or the second pads 334. In some embodiments, the second circuit structure 330*a* includes a driving circuit, and the driving circuit is electrically connected to the light-emitting elements 320. In this embodiment, each light-emitting element package structure 300*a* is electrically connected to the first circuit structure 200*a* through the first conductive connection structures 510. For example, the first pads 332 are bonded to the second circuit layer 230 of the first circuit structure 200*a* through the first conductive connection structures 510. In some embodiments, the size of the first pad 332 is larger than the size of the second pad 334, thereby improving the yield of the bonding process of the light-emitting element package structures 300*a* and the first circuit structure 200*a*. In addition, each light-emitting element package structure 300*a* includes a plurality of light-emitting elements 320, thereby improving the yield of the process of transferring the light-emitting elements 320 onto the first substrate 100.

The light-emitting elements 320 are located between the second substrate 310 and the first substrate 100 and emitting lights toward the first substrate 100. In this embodiment, the second circuit structure 330*a* has a groove 336 in which the light-emitting elements 320 are located. With the setting of the groove 336, the light emitting element 320 can be prevented from directly contacting the upper surface of the first substrate 100, and the requirement of the thickness T1 of the insulating structure 210 on the first substrate 100 can be reduced.

In this embodiment, the light-emitting elements 320 are electrically connected to the second pads 334. In some embodiments, the second pads 334 are disposed at the bottom of the groove 336. For example, the light-emitting elements 320 are connected to the second pads 334 through the second conductive connection structures 520. The second conductive connection structures 520 include solders (for example, tin, indium, bismuth, or other suitable materials or a combination of the foregoing materials) or conductive glue.

In this embodiment, each light-emitting element package structure 300*a* includes three light-emitting elements 320, and the three light-emitting elements 320 are light-emitting elements of different colors (for example, a red light-emitting element, a green light-emitting element, and a blue light-emitting element), and each light-emitting element package structure 300*a* corresponds to a color pixel, but the invention is not limited thereto. In other embodiments, each light-emitting element package structure 300*a* includes more light-emitting elements, and each light-emitting element package structure 300*a* corresponds to a plurality of color pixels. Alternatively, in some other embodiments, each light-emitting element package structure 300*a* only includes a single light-emitting element, and each light-emitting element packaging structure 300*a* corresponds to one sub-color pixel. In this embodiment, the light-emitting elements 320 are micro light-emitting diodes or other light-emitting elements.

FIGS. 4A to 4G are schematic cross-sectional views of a manufacturing method of a display device according to an embodiment of the present invention. It should be noted herein that, in embodiments provided in FIGS. 4A to 4G, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Figure 4A:
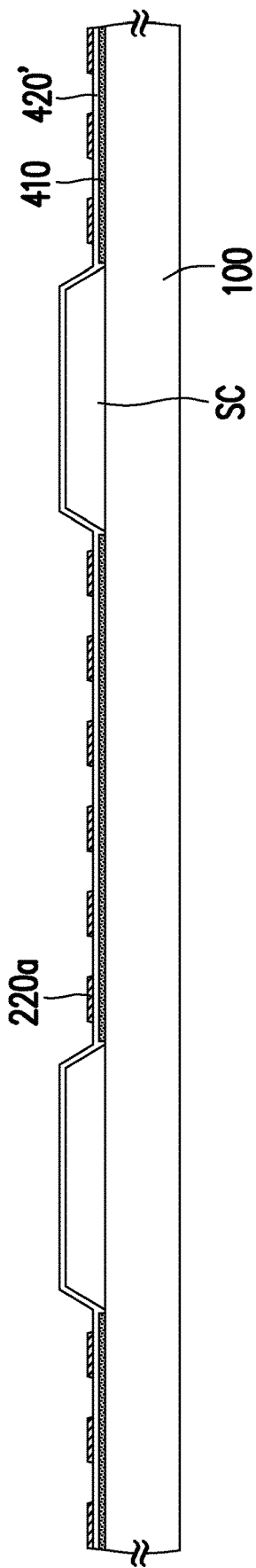

FIG. 4A continues the process of FIG. 2C. Referring to FIG. 4A, the first circuit layer 220*a* is formed on the first covering material layer 420'. In this embodiment, the first circuit layer 220*a* does not cover the side surfaces and the top surface of the sacrificial layer SC. In this embodiment, the first circuit layer 220*a* is a patterned conductive layer. For example, a conductive material is deposited on the first covering material layer 420', and then the conductive material is patterned to form the first circuit layer 220*a*.

Figure 4B:
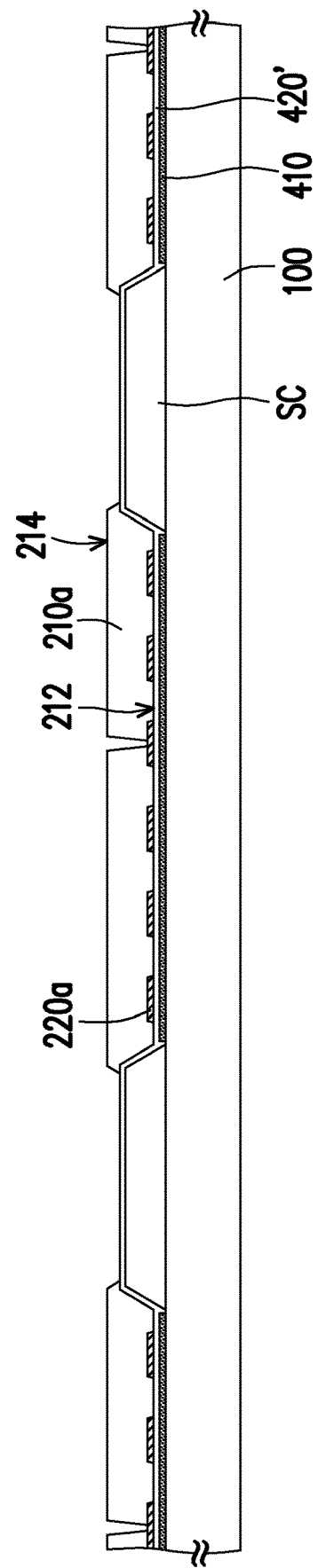

Referring to FIG. 4B, an insulating structure 210*a* is formed on the first circuit layer 220*a* and the first covering material layer 420'. The insulating structure 210*a* may be a single-layer or multi-layer structure. In this embodiment, the top surface (the second surface 214) of the insulating structure 210*a* is higher than the top surface of the sacrificial layer SC. In some other embodiments, the top surface (the second surface 214) of the insulating structure 210*a* may not be higher than the top surface of the sacrificial layer SC. In this embodiment, the insulating structure 210*a* includes a reflective material. For example, the insulating structure 210*a* includes organic materials and reflective particles distributed in the organic materials. The reflective particles are, for example, porous (or air-containing) silicon oxide ($SiO_2$), titanium oxide ($TiO_2$), aluminum oxide ($Al_2O_3$), calcium carbonate ($CaCO_3$), barium sulfate ($BaSO_4$), zirconium oxide ($ZrO_2$), metal-coated polymer particles, hollow polymer particles, or other light-reflecting microstructures, but the invention is not limited thereto. In some other embodiments, the insulating structure 210*a* is a multilayer structure, the top layer and/or the bottom layer of the insulating structure does not contain reflective materials, and the intermediate layer of the insulating structure contains reflective materials. In this embodiment, the insulating structure 210*a* can reflect light, so there is no need to provide a reflective layer on the sacrificial layer SC in the first circuit layer 220*a*. In other words, the first circuit layer 220*a* selectively does not overlap the sacrificial layer SC.

Referring to FIG. 4C, a second circuit layer 230 is formed on the insulating structure 210*a*.

Referring to FIG. 4D, a second covering material layer 430' is formed on the second circuit layer 230. In this embodiment, the second covering material layer 430' is in contact with the first covering material layer 420' on the top surface of the sacrificial layer SC.

Figure 4E:
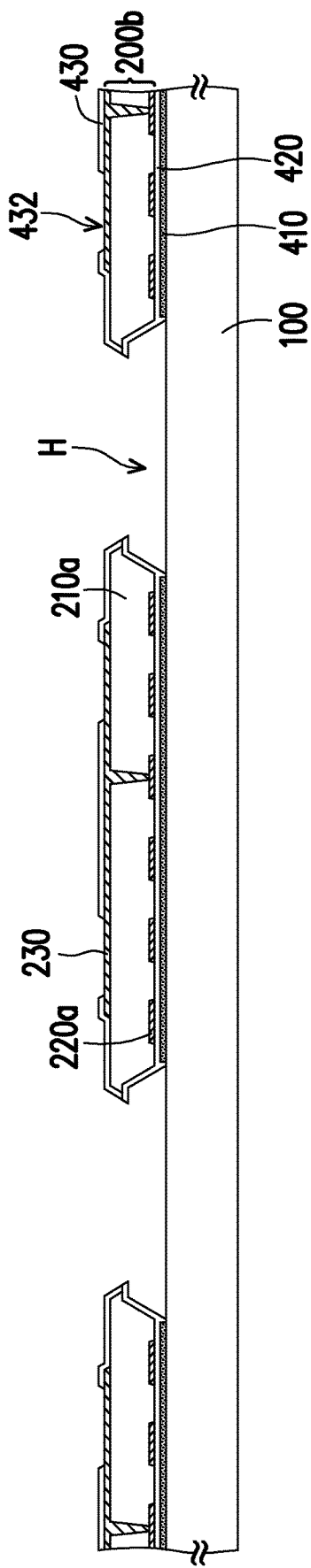

Referring to FIG. 4E, the sacrificial layer SC is removed by the process disclosed in FIG. 2I to form the hole H of the first circuit structure 200*b*. In this embodiment, while removing the sacrificial layer SC, the first covering material layer 420' on the top surface of the sacrificial layer SC and the second covering material layer 430' on the top surface of the sacrificial layer SC are removed together to form the first covering layer 420 and the second covering layer 430. In this embodiment, before removing the sacrificial layer SC, after removing the sacrificial layer SC, or while removing the sacrificial layer SC, the second covering material layer 430' is patterned to expose a part of the second circuit layer 230. In other words, the second covering layer 430 has openings 432 exposing the second circuit layer 230.

In some embodiments, the method for removing the sacrificial layer SC includes a stripping process, an etching process, or other suitable processes.

Figure 4F:
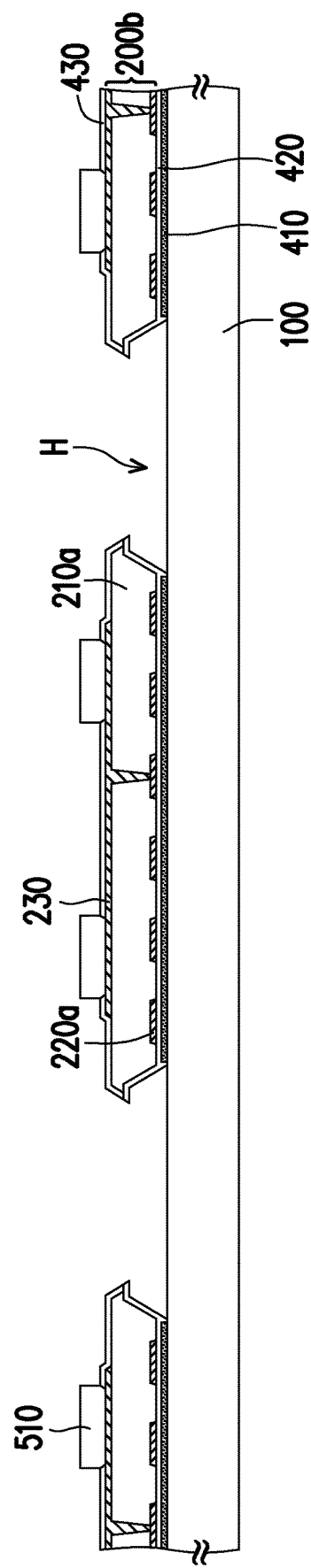

Referring to FIG. 4F, first conductive connection structures 510 are formed on the second circuit layer 230.

Figure 4G:
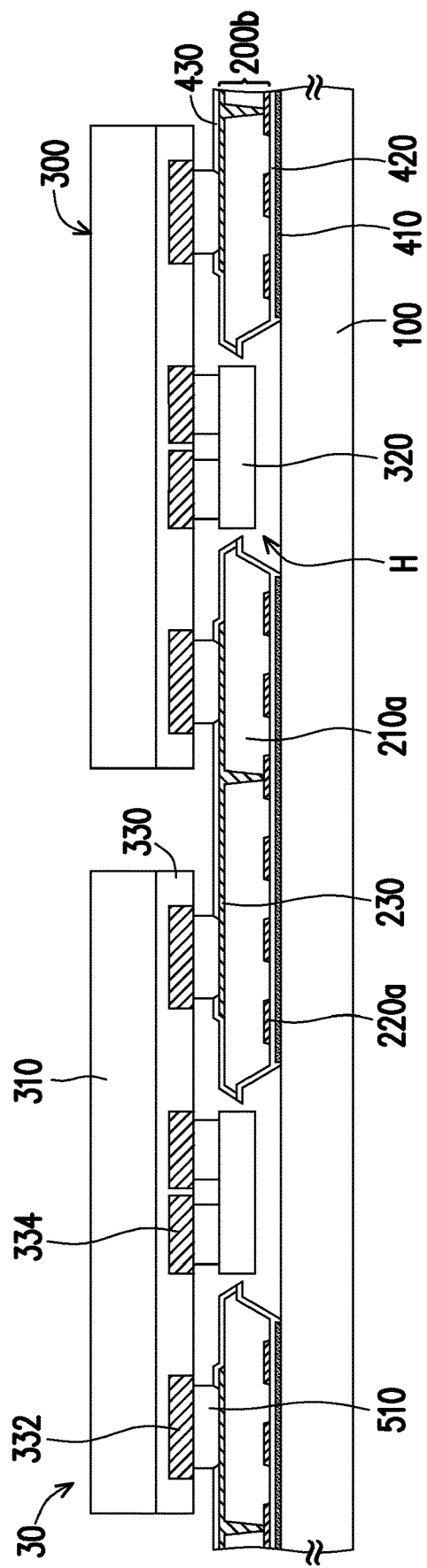

Referring to FIG. 4G, after forming the first conductive connection structures 510, the light-emitting element package structures 300 are bonded to the first circuit structure 200b. So far, the display device 30 is substantially completed.

In this embodiment, the insulating structure 210a of the first circuit structure 200b includes reflective materials. Therefore, there is no need to form an additional reflective layer on the sidewalls of the hole H of the first circuit structure 200b, and the insulating structure 210a can be used to reflect the lights emitted by the light-emitting elements 320 to the direction toward the first substrate 100, thereby improving the brightness of the display device 30.

Figure 5:
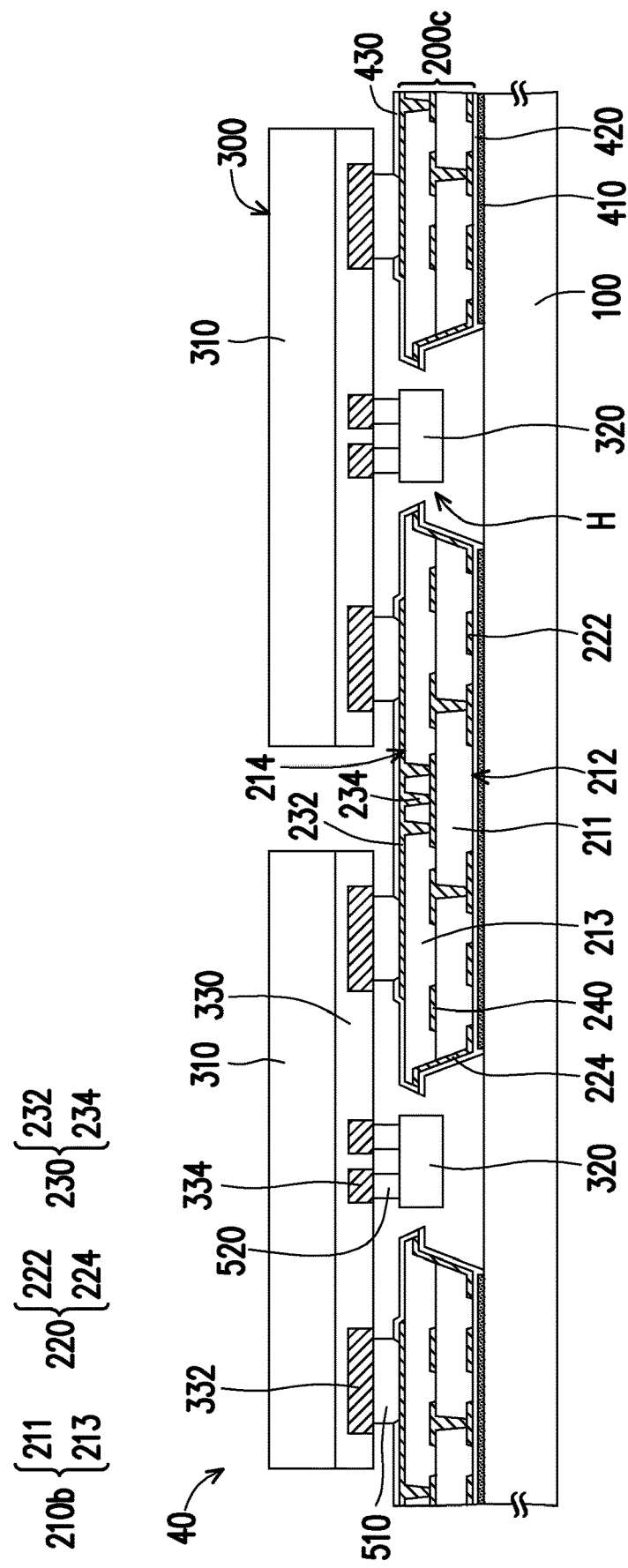
FIG. 5 is a schematic cross-sectional view of a display device according to an embodiment of the invention.

FIG. 5 is a schematic cross-sectional view of a display device according to an embodiment of the invention. It should be noted herein that, in embodiments provided in FIG. 5, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 5, in the display device 40, the first circuit structure 200c includes an insulating structure 210b, a first circuit layer 220, a second circuit layer 230, and a third circuit layer 240.

The insulating structure 210b has a first surface 212 facing the first substrate 100 and a second surface 214 facing away from the first surface 212. The insulating structure 210b includes a multi-layer structure. For example, the insulating structure 210b includes a first insulating layer 211 and a second insulating layer 213. The second insulating layer 213 overlaps the first insulating layer 211. The first insulating layer 211 and the second insulating layer 213 include the same or different materials. In this embodiment, the first surface 212 is located at the first insulating layer 211, and the second surface 214 is located at the second insulating layer 213. In this embodiment, the holes H of the first circuit structure 200c penetrates the first insulating layer 211 and the second insulating layer 213.

The first circuit layer 220 is located on the first surface 212 of the insulating structure 210b. The second circuit layer 230 is located on the second surface 214 of the insulating structure 210b. The third circuit layer 240 is located between the first insulating layer 211 and the second insulating layer 213. In some embodiments, the third circuit layer 240 is electrically connected to the first circuit layer 220 and the second circuit layer 230 through conductive holes, but the invention is not limited thereto. In this embodiment, the first circuit structure 200c includes a driving circuit, and the driving circuit is electrically connected to the light-emitting elements 320.

Based on the above, the width of the hole of the first circuit structure near the first substrate is greater than the width of the hole near the second substrate, so that the light emitted by the light-emitting element can be better reflected to the first substrate, thereby increasing the brightness of the display device.

What is claimed is:

1. A display device, comprising:
a first substrate;
a first circuit structure, located above the first substrate, and the first circuit structure has a plurality of holes; and
light-emitting element package structures, located above the first circuit structure, wherein each light-emitting element package structure includes:
a second substrate; and
at least one light-emitting element, located between the second substrate and the first substrate and emitting light toward the first substrate, and the at least one light-emitting element is overlapping with a corresponding hole of the first circuit structure, the width of the corresponding hole near the first substrate is greater than the width of the corresponding hole near the second substrate.

2. The display device of claim 1, wherein the width of the holes gradually decreases as the distance from the first substrate increases.

3. The display device of claim 1, wherein the first circuit structure comprises:
an insulating structure, having a first surface facing the first substrate and a second surface facing away from the first surface;
a first circuit layer, located on the first surface of the insulating structure; and
a second circuit layer, located on the second surface of the insulating structure.

4. The display device of claim 3, wherein the insulating structure protrudes toward the at least one light-emitting element near the sidewalls of the holes, and the position of the minimum width of the holes is located between the first surface and the second surface of the insulating structure.

5. The display device of claim 3, wherein the insulating structure comprises a reflective material.

6. The display device of claim 3, wherein the first circuit layer comprises:
reflective layers, located on sidewalls of the holes, and the insulating structure does not comprise reflective materials; and
signal lines, located on the first surface of the insulating structure.

7. The display device of claim 6, wherein the reflective layers extend from the sidewalls of the holes to the first surface of the insulating structure.

8. The display device of claim 6, wherein the at least one light-emitting element comprises light-emitting elements, and a vertical projection of the reflective layers on the first substrate has openings overlapping with the light-emitting elements.

9. The display device of claim 3, wherein the second circuit layer is electrically connected to the first circuit layer.

10. The display device according to claim 3, wherein the insulating structure comprises:
a first insulating layer; and
a second insulating layer, overlapping with the first insulating layer, wherein the first circuit structure further comprises:
a third circuit layer, located between the first insulating layer and the second insulating layer.

11. The display device of claim 10, wherein the holes penetrate through the first insulating layer and the second insulating layer.

12. The display device of claim 3, wherein the thickness of the insulating structure is 4 micrometers to 10 micrometers.

13. The display device of claim 1, wherein the first circuit structure comprises a driving circuit, and the driving circuit is electrically connected to the at least one light-emitting element.

14. The display device of claim 1, wherein each light-emitting element package structure further comprises:

a second circuit structure, located on the second substrate, and the second circuit structure has a groove, wherein the at least one light-emitting element is located in the groove.

15. The display device of claim 14, wherein the second circuit structure comprises a driving circuit, and the driving circuit is electrically connected to the at least one light-emitting element.

16. The display device of claim 1, wherein each light-emitting element package structure further comprises a second circuit structure, and the second circuit structure comprises:
   at least one first pad, electrically connected to the first circuit structure; and
   at least one second pad, electrically connected to the at least one light-emitting element, wherein the size of the at least one first pad is larger than the size of the at least one second pad.

17. The display device of claim 1, wherein the at least one light-emitting element is located in the corresponding hole.

18. The display device of claim 1, further comprises:
   a light-shielding layer, located above the first substrate, and having through holes overlapping with the holes;
   a first covering layer, located on the light-shielding layer, and a part of the first covering layer is located between the first substrate and the first circuit structure; and
   a second covering layer, located on the first circuit structure and between the first circuit structure and the second substrate.

19. The display device of claim 18, wherein the first covering layer is connected to the second covering layer in the holes.

* * * * *